(12) United States Patent
Chen et al.

(10) Patent No.: US 11,209,593 B2
(45) Date of Patent: Dec. 28, 2021

(54) ERASABLE OPTICAL COUPLER

(71) Applicant: University of Southampton, Highfield (GB)

(72) Inventors: Xia Chen, Highfield (GB); Milan Milosevic, Highfield (GB); Graham Trevor Reed, Highfield (GB); David John Thomson, Highfield (GB)

(73) Assignee: UNIVERSITY OF SOUTHAMPTON, Highfield (GB)

( * ) Notice: Subject to any disclaimer, the term of this patent is extended or adjusted under 35 U.S.C. 154(b) by 0 days.

(21) Appl. No.: 16/580,298

(22) Filed: Sep. 24, 2019

(65) Prior Publication Data
US 2020/0088943 A1 Mar. 19, 2020

Related U.S. Application Data

(63) Continuation of application No. PCT/GB2018/050651, filed on Mar. 14, 2018.

(30) Foreign Application Priority Data

Mar. 24, 2017 (GB) ...................................... 1704690

(51) Int. Cl.
| | |
|---|---|
| G02B 6/34 | (2006.01) |
| G02B 6/134 | (2006.01) |
| C23C 14/48 | (2006.01) |
| G01M 11/00 | (2006.01) |
| G02B 6/12 | (2006.01) |

(52) U.S. Cl.
CPC ............ G02B 6/1347 (2013.01); C23C 14/48 (2013.01); G01M 11/35 (2013.01);
(Continued)

(58) Field of Classification Search
CPC ............................. G02B 6/1225; G02B 6/1347
See application file for complete search history.

(56) References Cited

U.S. PATENT DOCUMENTS

| | | | |
|---|---|---|---|
| 2004/0017974 A1 | 1/2004 | Balch et al. | |
| 2004/0126072 A1* | 7/2004 | Lee et al. ................... | C25F 3/12 |
| | | | 385/122 |

(Continued)

FOREIGN PATENT DOCUMENTS

| | | |
|---|---|---|
| JP | 59121307 A | 7/1984 |
| JP | 2004126088 A | 4/2004 |

OTHER PUBLICATIONS

Chen, et al., "Development of Ion-implanted Optical Waveguides in Optical Materials: A Review", Optical Materials, vol. 29, Issue 11, Jul. 2007, pp. 1523-1542.

(Continued)

*Primary Examiner* — Eric Wong
(74) *Attorney, Agent, or Firm* — Kilpatrick Townsend & Stockton LLP

(57) ABSTRACT

The disclosure provides a method of forming an erasable optical coupler in a photonic device comprising a conventional optical waveguide formed in a crystalline wafer. The method comprises selectively implanting ions in a localized region of the wafer material adjacent to the conventional waveguide of the photonic device, to cause modification of the crystal lattice structure of, and a change in refractive index in, the ion implanted region of the wafer material to thereby form an ion implanted waveguide optically coupled to the adjacent conventional waveguide to couple light out therefrom, or in thereto. The crystalline wafer material and ion implanted waveguide are such that the crystal lattice structure or composition can be modified to adjust or remove the optical coupling with the conventional waveguide by further modification of the refractive index in the ion implanted region.

20 Claims, 9 Drawing Sheets

(52) U.S. Cl.
CPC .............. *G02B 2006/12061* (2013.01); *G02B 2006/12097* (2013.01); *G02B 2006/12147* (2013.01); *G02B 2006/12169* (2013.01)

(56) References Cited

U.S. PATENT DOCUMENTS

| | | | | |
|---|---|---|---|---|
| 2011/0274393 | A1* | 11/2011 | Reed | G02B 6/12007 385/37 |
| 2013/0142493 | A1* | 6/2013 | Agranat | C23C 14/48 385/129 |
| 2016/0004010 | A1 | 1/2016 | Miller et al. | |
| 2020/0150344 | A1* | 5/2020 | Jayatilleka | G02B 6/12007 |

OTHER PUBLICATIONS

Chen, "Fabrication and Characterization of Waveguides in LiNbO3 Written With Femtosecond Laser Pulses", Spie Defense and Security Symposium, vol. 7749, Jul. 13, 2010, pp. 77490U-1-77490U-4.

GB1704690.5, "Search Report", dated Jul. 21, 2017, 5 pages.

PCT/GB2018/050651, "International Search Report and Written Opinion", dated Jun. 20, 2018, 19 pages.

Tan, "Formation of Reconfigurable Optical Channel Waveguides and Beam Splitters on Top of Proton-implanted Lithium Niobate Crystals Using Spatial Dark Soliton-like Structures", Journal of Physics, vol. 41, Apr. 8, 2008, pp. 10465-10470.

Topley, et al., "Locally Erasable Couplers for Optical Device Testing in Silicon on Insulator", Journal of Lightwave Technology, vol. 32, No. 12, Jun. 15, 2014, pp. 2248-2253.

Yang, "Direct-Write Embedded Waveguides and Integrated Optics in Bulk Glass by Femtosecond Laser Pulses", Optical Engineering, vol. 44, No. 5, May 1, 2005, pp. 051104-1-051104-6.

18714025.6, "European Patent Office Examination Report", dated Jun. 30, 2021, 8 pages.

A. Roberts, et al., "Fabrication of Buried Channel Waveguides in Fused Silica Using Focused MeV Proton Beam Irradiation", Journal of Lightwave Technology, IEEE, vol. 14, No. 11, XP011028702, ISSN: 0733-8724, Nov. 1, 1996, 4 pages.

* cited by examiner

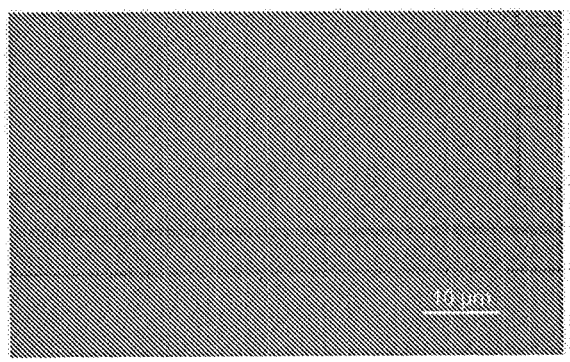
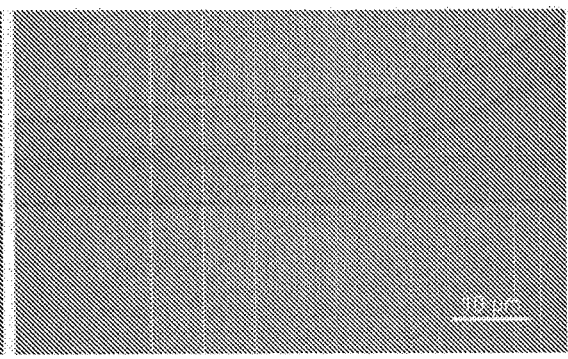
FIG. 11a                FIG. 11b
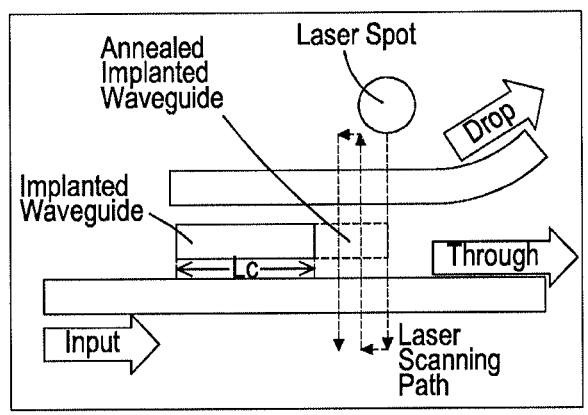
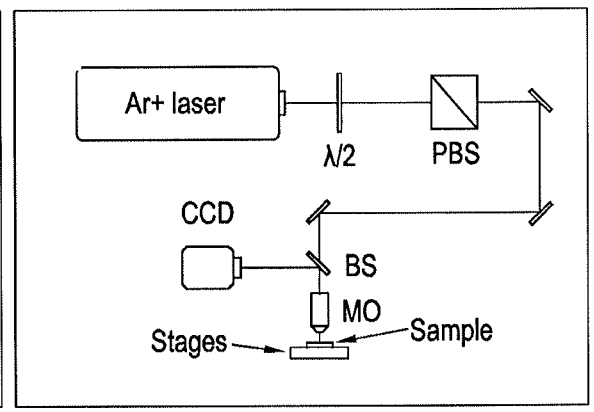
FIG. 12a                FIG. 12b FIG. 15a
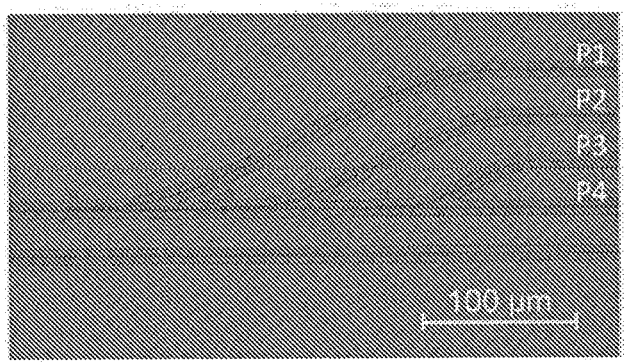
FIG. 15b
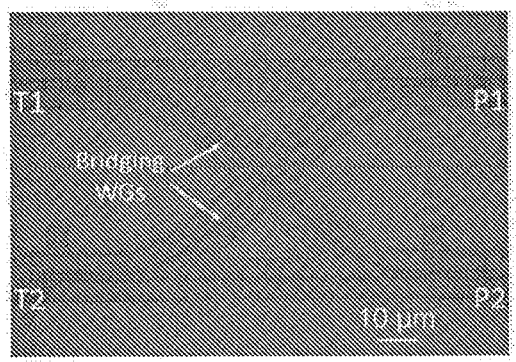
FIG. 16a
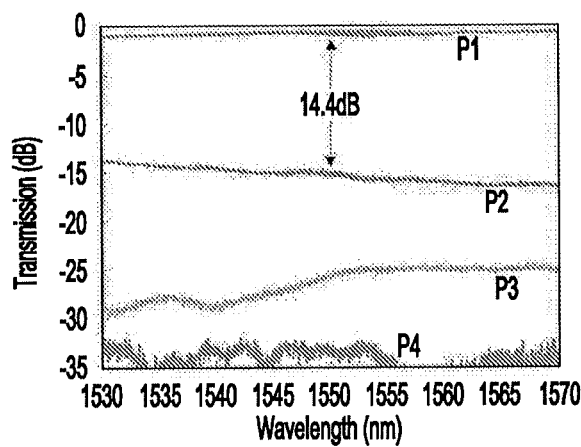
FIG. 16b
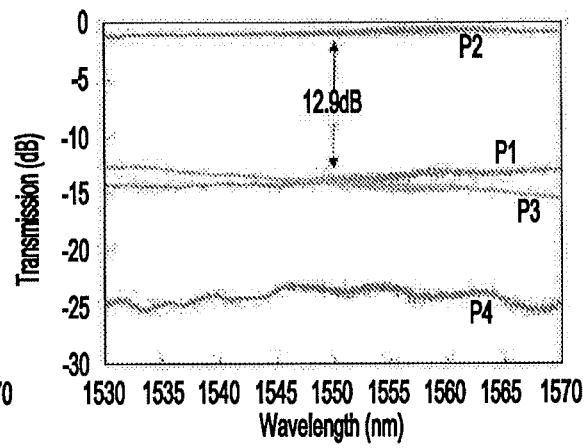
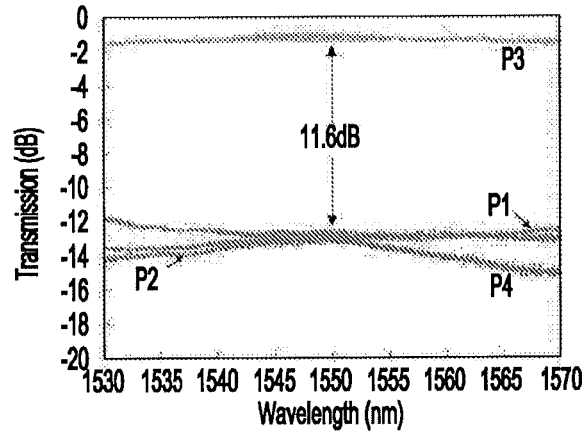
FIG. 16c
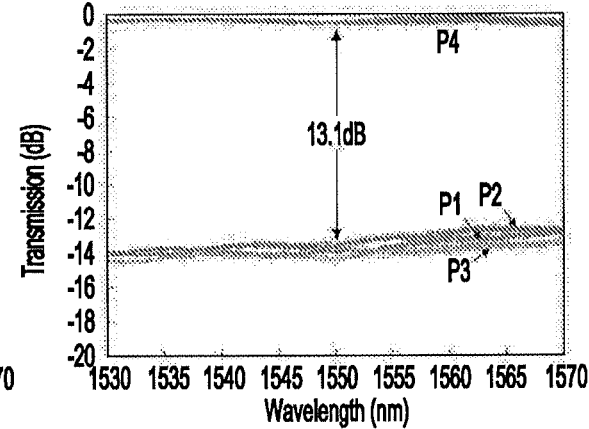
FIG. 16d

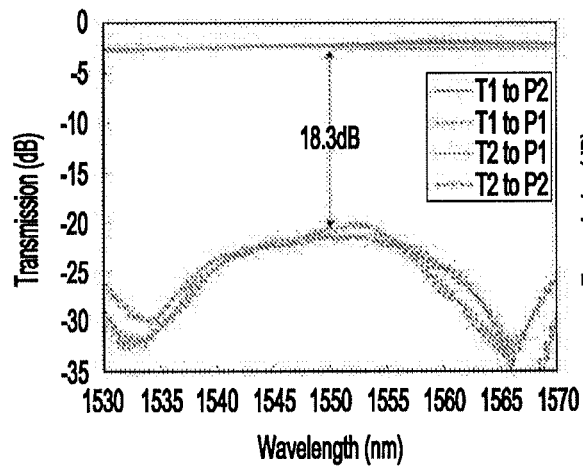
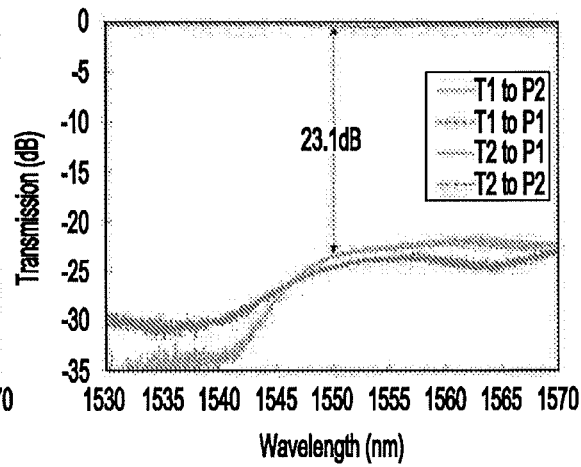
FIG. 17a
FIG. 17b
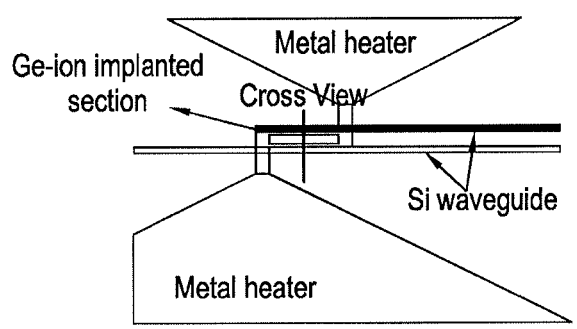
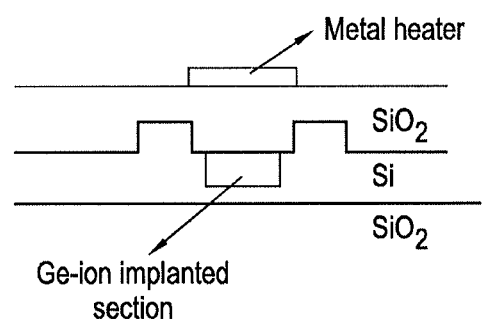
FIG. 18a
FIG. 18b

ERASABLE OPTICAL COUPLER

CROSS-REFERENCES TO RELATED APPLICATIONS

This application claims priority to and is a continuation of International Patent Application No. PCT/GB2018/050651, filed Mar. 14, 2018; which claims priority from GB Patent Application No. 1704690.5, filed Mar. 24, 2017, the entire contents of which are hereby incorporated by reference in their entirety for all purposes.

BACKGROUND OF THE INVENTION

Generally photonic integrated chips (PICs) can only be tested at their inputs and outputs once fabrication is complete. This leads to high failure rates and unnecessary processing of failed chips, raising costs and lowering yield. This limits the cost-effectiveness of PICs and their manufacture and therefore limits their uptake. It would be desirable to improve the yield and cost effectiveness of PIC manufacture, and one way to do this is to facilitate improved wafer-scale testing throughout the manufacturing process.

Wafer-scale autonomous testing is a crucial component of any large scale semiconductor manufacturing line. Such systems allow testing of photonic circuits at intermediate points along waveguides formed in a substrate or wafer between photonic components of the photonic device, provided e.g. as a PIC, under manufacture. This testing at intermediate points allows the performance of individual photonic components or groups of components to be evaluated, hence allowing poor device performance or photonic circuit failures to be detected at an early stage. Remedial action can then be taken, either by repairing the photonic circuit, or cessation of further processing to reduce fabrication costs.

One of the current market solutions is using conventional directional couplers to couple light power out of conventional waveguides for wafer scale-testing, for example using a directional coupler. Such a directional coupler is permanently fabricated within the photonic circuit, and cannot be removed after testing. Therefore, the optical power that transfers through the directional coupler for testing is a permanent loss mechanism for the photonic circuit during normal operation. As a result, a limited number of such structures can be used in a circuit, and the optical power available for testing at the directional coupler is limited. Further, the optical power of the operational outputs of the photonic integrated circuit is similarly limited by the directional couplers provided for testing.

It is in this context that the present invention has been devised.

SUMMARY OF THE INVENTION

This present application relates to coupling light in photonic devices such as photonic integrated circuit (PIC) chips, particularly into and out of waveguides formed in a wafer or substrate material thereof, to facilitate wafer-scale autonomous testing or other applications. In particular, the application is directed to couplers, photonic devices in particular photonic integrated circuits including said couplers, or in which the coupler is no longer coupled, apparatuses and methods for forming and/or for erasing couplers on photonic devices, and apparatuses and methods for testing the photonic devices using said couplers.

The present disclosure provides, in examples, a method of forming an erasable optical coupler in a photonic device comprising a conventional optical waveguide formed in a crystalline wafer. The method comprises selectively implanting ions in a localized region of the wafer material adjacent to the conventional waveguide of the photonic device, to cause modification of the crystal lattice structure of, and a change in refractive index in, the ion implanted region of the wafer material to thereby form an ion implanted waveguide optically coupled to the adjacent conventional waveguide to couple light out therefrom, or in thereto.

Some examples further comprise controlling, in the selective ion implantation, one or more of the size, shape, or location of the localized region of the wafer material in which ions are to be implanted, or the direction of implantation, or the species, dosage or energy of the implanted ions, to control the optical coupling between the conventional waveguide and the ion implanted waveguide formed thereby.

In some examples, the size, shape, or location of the localized region, the direction of implantation, and the species, dosage and energy of the implanted ions, are selected to obtain a predetermined amount of optical coupling between the conventional waveguide and the ion implanted waveguide.

In some examples, the crystalline wafer material and ion implanted waveguide are such that the crystal lattice structure or composition can be modified to adjust or remove the optical coupling with the conventional waveguide by further modification of the refractive index in the ion implanted region.

In some examples, further modification of the refractive index of the ion implanted region comprises the application of heat, optionally by annealing.

In some examples, further modification of the refractive index of the ion implanted region comprises additional ion implantation.

In some examples, the method may further comprise heating the implanted region to modify the crystal structure of the wafer material in the implanted region to change the refractive index thereof and adjust or remove the optical coupling with the adjacent conventional waveguide. In some examples, heating the implanted region may comprise heating by localized annealing. In some examples, the heating may comprise optical absorption in the wafer material or wherein the heating comprises passing an electrical current through a resistive heating element arranged on the photonic device so as to locally heat and anneal the ion implanted region.

In some embodiments, the implanted ions are Si or Ge. In some embodiments, the implanted ions modify the crystal lattice structure of the device material from a more ordered state to a less ordered state. The less ordered state may be an amorphous state. In some embodiments, the heating the ion implanted waveguide changes the crystal lattice structure therein from a less ordered state to a more ordered state.

In some embodiments, selectively implanting the ions in the localized region of the wafer material comprises: depositing a mask material onto the device; processing the mask material to form at least one opening adjacent to the conventional waveguide of the photonic device; and implanting ions in the wafer material through the opening of the mask adjacent to the conventional waveguide of the photonic device. In some embodiments, the mask comprises: a photoresist layer; and/or a hardmask, optionally wherein the hardmask is formed of $SiO_2$. In some embodiments, processing the mask includes: patterning a mask material with a photolithographic or e-beam lithographic process; and etching the mask material to form the at least one opening of the mask.

In some embodiments, the method further comprises providing a further, test waveguide coupled to the ion implanted waveguide to couple light into and out of the conventional waveguide of the photonic device through the ion implanted waveguide. In some embodiments, the coupling of light among the conventional waveguide, the ion implanted waveguide and the test waveguide is via evanescent coupling or directly butt-coupling. In some embodiments, the coupling of light from the waveguide to the testing waveguide includes a butt joint.

In some embodiments, the conventional waveguide is formed as a rib waveguide. In some embodiments, the method further comprises: forming the conventional waveguide as a rib waveguide structure in the wafer material; implanting the ions adjacent the rib structure of the conventional waveguide.

In some embodiments, the wafer material is silicon.

The present disclosure further provides, in examples, a method, comprising implanting ions into a wafer material adjacent to a conventional waveguide of a photonic device provided thereby, the ion implanting being to form a waveguide in the wafer material configured as an optical coupler to couple light into and out of the conventional waveguide. The method may further comprise coupling light into and out of the conventional waveguide via the adjacent coupler waveguide to test the photonic device, and heating the substrate to remove the adjacent coupler waveguide after the testing.

The present disclosure further provides, in examples, an apparatus, comprising a substrate formed of a wafer material, a conventional optical waveguide formed by the wafer material, an optical coupler waveguide formed temporarily in the wafer material adjacent to the conventional optical waveguide, the optical coupler being configured to couple light in to, or out of, the conventional optical waveguide during a test, and wherein the wafer material and optical coupler waveguide are such that the optical coupling between the optical coupler waveguide is removable by heating the wafer material.

In some embodiments, the apparatus may further comprise a test system configured to test the apparatus by coupling light in to, or out of, the conventional waveguide through the optical coupler waveguide.

In some embodiments, the apparatus may further comprise an eraser system configured to heat a region including the optical coupler waveguide to modify the crystal structure of the wafer material in the region to change the refractive index thereof and remove the optical coupling with the adjacent conventional waveguide. In some embodiments, the eraser system comprises or a resistive heating element arranged to on the photonic device so as to locally heat and anneal the ion implanted region when an electrical current passes through the resistive heating element.

In some embodiments, the conventional optical waveguide is formed as a rib waveguide structure, optionally wherein the optical coupler is formed adjacent to a rib waveguide of the rib waveguide structure.

In some embodiments, the apparatus may further comprise a test waveguide coupled to the optical coupler waveguide to couple light into and out of the conventional waveguide of the photonic device through the optical coupler waveguide.

In some embodiments, the optical coupling between the optical coupler waveguide and the conventional waveguide has been removed by the refractive index of the optical coupler waveguide having been changed.

The present disclosure further provides, in examples, an apparatus for forming an erasable coupling region on a photonic device, comprising implanting means for implanting ions into a material of the photonic device, and computer readable instructions to control one or more of the size, shape, or location of a localized region of the material in which ions are to be implanted, or the species, dosage or energy of the implanted ions, to control coupling in the photonic device.

The present disclosure further provides, in examples, an apparatus for testing an erasable optical coupler in a waveguide device, comprising means for inputting and/or outputting optical signals into a conventional waveguide through an erasable optical coupler.

The present disclosure further provides, in examples, an apparatus for erasing an optical coupler comprising means for localized annealing of a material of the waveguide device, optionally wherein the means for localized annealing comprises a light source.

Some examples provide a system for sequentially producing a photonic device, comprising forming, using the apparatus described above, an erasable optical coupler, testing, with the apparatus described above, the erasable optical coupler, and erasing, with the apparatus described above, the coupling ability of the optical coupler.

An erasable optical coupler as described above can be fabricated in a spatially efficient manner, preserving real estate on a photonic integrated chip (PIC). Furthermore, the erasable nature of the optical coupler allows removal after a testing procedure, resulting in minimal signal loss in the PIC during operation. Thus, the erasable optical coupler as described above enables the identification of defective chips during the fabrication process, reducing the processing wastage associated with PIC fabrication.

One method of testing photonic circuits is by using diffractive gratings implanted in waveguides, which can be removed after testing. An example of this is described in R. Topley et al, "Locally erasable couplers for optical testing in silicon on insulator," Journal of Lightwave Technology, vol. 32, issue no 12, pp. 2248-2253, 2014, which is incorporated by reference in its entirety. However the present inventors have discovered that, testing with implanted diffractive gratings is not spatially efficient because the waveguides need to be tapered up over a distance to a larger waveguide size, at which the diffractive grating is implanted, and then tapered back down over another distance, in order to provide the light out for testing. As a result of this tapering length, the gratings take up a large amount of space on the PIC and cause the PICs to need to be large, or otherwise only a small number of gratings can be implanted. In these grating couplers, which may be removed after testing/use, the tapers connecting grating couplers and photonic waveguides are normally over $100\mu m$ in length to obtain a good coupling efficiency. Each testing point with a grating coupler would require two tapers, which occupies additional space (over $20\mu m \times 200\mu m$) within a photonic circuit. Further, the coupling efficiency of these diffractive gratings is not as high as for conventional gratings. These two factors limit their practicality and usefulness. The erasable directional couplers of the present disclosure do not suffer from these drawbacks.

BRIEF DESCRIPTION OF THE DRAWINGS

Embodiments of the invention are further described hereinafter with reference to the accompanying drawings, in which:

FIGS. 11a-b shows optical microscope images of fabricated directional couplers of a single-stage directional coupler (FIG. 11a) as illustrated in FIG. 1 and a dual-stage directional coupler (FIG. 11b) as illustrated in FIG. 2;

FIG. 12a is a diagram showing a sequential annealing of the coupling length of the directional coupler using repeated passes of a localized laser annealing system in accordance with an embodiment of the present disclosure;

FIG. 12b shows an experimental setup used for sequentially locally annealing parts of the ion implantation region of the directional couplers of FIGS. 11a and 11b to reduce the coupling length by scanning a laser along a scanning path as shown in FIG. 12a;

FIG. 15a shows optical microscope images of fabricated photonic switching circuits of a 1×4 photonic switching circuit;

FIG. 15b shows optical microscope images of fabricated photonic switching circuits of a 2×2 photonic switching circuit;

FIGS. 16a-d is a series of graphs showing the coupled light intensity through the four different output ports of the 1×4 photonic switching circuit shown in FIG. 15a as directional couplers at different junctions of the circuit are annealed and removed;

FIGS. 17a-b is a series of graphs showing the coupled light intensity through different combinations of input and output ports of the 2×2 photonic switching circuit shown in FIG. 15b as directional couplers at different junctions of the circuit are annealed and removed; and FIGS. 18a-b shows an arrangement of a photonic device having a resistive heating element arranged on the photonic device for locally heating and annealing the ion implanted region.

DETAILED DESCRIPTION OF THE INVENTION

Figure 1:
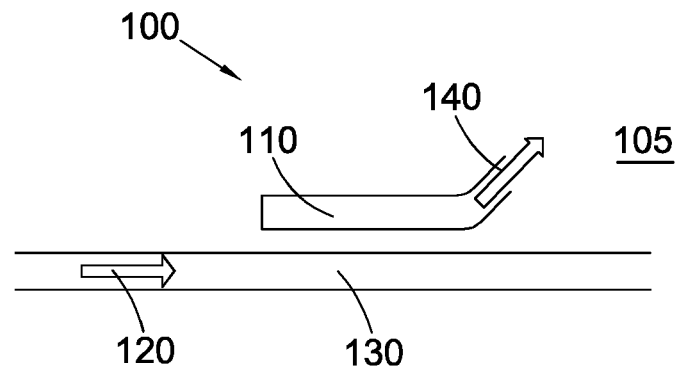
FIG. 1 is a diagram showing an optical coupler in accordance with an embodiment of the present disclosure.
Figure 2:
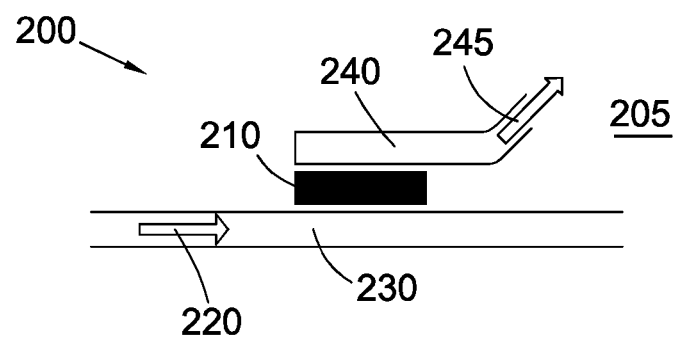
FIG. 2 is a diagram showing an optical coupler in accordance with a second embodiment of the present disclosure.

In the examples of the present disclosure, space-efficient erasable optical couplers for wafer-scale testing allow increased wafer real estate for photonic circuit fabrication. The optical couplers disclosed herein are directional couplers, and operate to couple operational and/or test wavelengths of light into or out of a conventional waveguide in a photonic circuit, for example provided as a PIC on an SOI wafer. FIGS. 1 and 2 show, in detail, such example photonic circuits 100, 200 including couplers.

An ion-implanted region in a PIC wafer material generally has a higher refractive index than the bulk material of that wafer 105, 205, and thus the examples of the present disclosure utilize this phenomenon to create an ion implanted region 110, 210 that forms an implanted waveguide optical coupler 110, 210 to couple light into and/or out of a conventional waveguide. With this ion implanted waveguide region 110, 210 formed adjacent to a conventional waveguide 130, 230, a directional coupling is formed. The ion-implanted waveguide optical coupler 110, 210 is formed in a region of the wafer material adjacent to and spaced apart from the conventional waveguide 130, 230. In examples, the ion-implanted waveguide optical coupler 110, 210 and the conventional waveguide 130, 230 are spaced apart by a distance, typically around 100 nm or greater, in examples, by hundreds of nm. That is, the ion implanted region forming the ion-implanted waveguide optical coupler 110, 210 is spatially separated from, and does not form part of or overlap spatially with the conventional waveguide 130, 230. The ion-implanted waveguide optical coupler 110, 210 and the conventional waveguide 130, 230 run alongside one another over a distance over which light can be coupled between the ion-implanted waveguide optical coupler 110, 210 and the conventional waveguide 130, 230. That is, light travelling in one direction in one of the waveguides in parallel to the other waveguide for a sufficient waveguide length becomes coupled into the other waveguide through mode coupling of the evanescent field. For parallel waveguides, which may be configured to couple light of a certain wavelength between them, the amount of coupled light from one waveguide to the other increases over the coupling distance until it reaches a maximum, after which the amount of coupled light again reduces for greater distances until it reaches a minimum again. Indeed, the amount of coupled light cyclically increases and decreases as the coupling length increases. The spacing between the implanted waveguide optical coupler 110, 210 and the conventional waveguide 130, 230 may be such that evanescent coupling of light, for example, light of a test wavelength or light source, from one waveguide to the other is achieved. Similarly, the length over which a section of the implanted waveguide optical coupler 110, 210 and the conventional waveguide 130, 230 is substantially parallel and over which light is coupled between them may be such that a desired amount of light coupling (such as a percentage of transferred light energy) is achieved. Forming the ion-implanted region 110, 210 by controlling, in selective ion implantation, one or more of the size, shape, or location of the localized region of the wafer material in which ions are to be implanted, or the direction of implantation, or the species, dosage or energy of the implanted ions, the optical coupling between the conventional waveguide 130, 230 and the ion implanted waveguide 110, 210 can be controlled. Light can be coupled out from the conventional waveguide 130, 230 into the implanted waveguide coupler 110, 210 within a relatively short distance of a few microns. Similarly, light can be coupled in reverse, from the implanted waveguide coupler 110, 210 into the conventional waveguide 130, 230. Light can therefore be coupled in to, or out of, a conventional waveguide 130, 230 for testing by using one or more implanted waveguide couplers 110, 210.

After testing, the ion implanted waveguide 110, 210 can be erased or removed. An annealing process, or further implantation, can change the refractive index of the bulk material 105, 205 of the wafer in the ion implanted region waveguide 110, 210, and can disengage or uncouple the implanted waveguide coupler 110, 210 from the conventional waveguide 130, 230. In an example, an annealing process can be carried out for an entire wafer or photonic device, or in a localized area surrounding an implanted region, to anneal the implanted waveguide coupler.

There is no permanent change required to a conventional waveguide 130, 230 or photonic circuit design to fabricate the abovementioned implanted waveguide coupler 110, 210. After testing and removal of the coupler, light in the conventional waveguide 130, 230 is no longer coupled into the implanted waveguide coupler 110, 210, and thus the conventional waveguide 130, 230 is no longer significantly affected by the coupler 110, 210 in terms of light transmission.

Thus, in an exemplary embodiment, a structure is disclosed which can couple light out from a photonic chip to facilitate wafer-scale autonomous testing or other applications. The structure does not require any permanent modification of the original photonic circuit. It can be erased after testing is complete, and will leave the original photonic circuit unperturbed.

Wafer-scale autonomous testing is a crucial component of any large scale semiconductor manufacturing line. Therefore such a system allows the testing of photonic circuits at intermediate points in order to evaluate the performance of individual photonic components, hence allowing poor device performance or photonic circuit failures to be detected at an early stage and to be either repaired, or for further processing to cease to reduce fabrication costs.

Turning now to FIG. 1 in particular, this illustrates an exemplary embodiment of an erasable implanted waveguide in a photonic circuit 100 in accordance with the present disclosure. In an example, the photonic circuit 100 comprises one or more conventional waveguides in a rib waveguide structure on a Si wafer 105. The erasable waveguide of FIG. 1 uses a section of implanted waveguide 110, which is typically a few microns in length, to couple light signals 120 out from a conventional waveguide 130 of photonic circuit 100. The light signals 120 in the implanted waveguide 110 can be coupled to another waveguide via implanted waveguide coupler 110, for wafer-scale testing. This is illustrated by light signal 140. It will be understood that this process could be carried out in reverse, and light signal 140 could be an input signal, via implanted waveguide 110, into conventional waveguide 130. After testing or other photonic circuit evaluation, the implanted waveguide 110 can be erased. This erasing can be carried out by annealing: either of the entire photonic circuit 100, or by a localized process surrounding implanted waveguide 110; or by further ion implantation to implanted waveguide 110. Therefore the original photonic circuit 100, including conventional waveguide 130, would not be affected optically by the implanted waveguide testing structure 110. Compared to alternative methods, this approach has a reduced photonic circuit footprint, and can offer high coupling efficiency. Furthermore, it requires no permanent change to the photonic circuit.

FIG. 2 illustrates a second exemplary embodiment of an erasable implanted waveguide in a photonic circuit 200 in accordance with the present disclosure. In an example, the photonic circuit 200 comprises one or more conventional waveguides in a rib waveguide structure on a Si wafer 205. FIG. 2 illustrates a two-stage directional coupler. An implanted waveguide coupler 210 is fabricated between two conventional waveguides, 230 and 240. In this exemplary embodiment, light signals 220 in conventional waveguide 230 can couple to the second conventional waveguide 240 through the implanted waveguide coupler 210 between them. This enables wafer scale testing via the extraction of light from conventional waveguide 230 to conventional waveguide 240, which may be a test node waveguide. It will be understood that this process can be reversible, and light output 245 from conventional waveguide 240 could be an input of light, and implanted waveguide coupler 210 can couple this light to conventional waveguide 230 for testing. After a testing process, the implanted waveguide coupler 210 can be removed, either by annealing of the entire photonic circuit 200, or localized annealing surrounding implanted waveguide coupler 210. The coupling of implanted waveguide coupler 210 can also be halted by further ion implantation. After disengaging implanted waveguide coupler 210, any light power in conventional waveguide 230 will continue through this waveguide, and not be coupled to conventional waveguide 240 via implanted waveguide 210.

Figure 3:
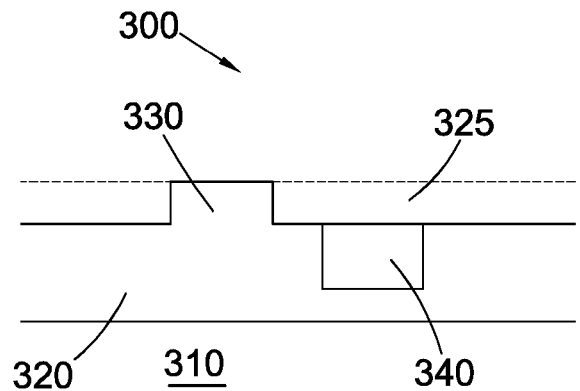
FIG. 3 is a cross section of an erasable optical coupler in accordance with an embodiment of the present disclosure.

FIG. 3 illustrates a cross sectional view of an implanted waveguide coupler in a photonic circuit structure 300 in accordance with an exemplary embodiment of the present disclosure. In an example, the photonic circuit structure 300 is embodied in a silicon on insulator (SOI) wafer which may include a bulk silicon layer (not shown) and SiO2 buried insulating layer 310, and a top silicon layer 320 provided on the insulating layer 310. In an example, the top silicon layer 320 may be approximately 220 nm thick, and the buried oxide insulating layer 310 may be 2000 nm thick. A conventional waveguide 330 is formed by etching, however it will be understood that the conventional waveguide 330 may be formed by other fabrication methods. In an example, the conventional waveguide 330 is formed by an approximately 70 nm etch 325 to the top silicon layer 320. In one example, the width of the conventional waveguide is 500 nm.

The conventional waveguide 330 is said to have a 'rib' structure, in which the top silicon layer 320 is only etched partially down towards the buried insulating layer 310 to leave the conventional waveguide 330 projecting from a slab of silicon remaining on the insulator 310 (as opposed to a 'strip' waveguide in which the top silicon layer is completely etched down to the buried insulating layer 310). An implanted waveguide 340 is then formed on the slab region of the top silicon layer 320 adjacent to the rib structure of the conventional waveguide 330. In an example, the implanted waveguide 340 is formed by implanting Ge ions to a target depth of 140 nm. In an example, the width of the implanted waveguide is approximately 500 nm. The implantation of ions into the silicon top layer 320 changes the refractive index of the implanted region by modifying the crystal lattice of the silicon in that region, allowing coupling to occur between the implanted region forming the implanted waveguide 340, and the conventional waveguide 330. The implanted waveguide coupler 340 can therefore couple light out from, or in to, the conventional waveguide 330, for example during testing of the photonic circuit structure 300 and conventional waveguide 330. An example is provided here, however it will be understood that the depth, width, and other parameters such as ion implant dosage, ion species, etc. will define the effective refractive index of the optical mode in the implanted waveguide 340. The difference between this index and the effective refractive index in the conventional waveguide 330 will affect how much light power can couple between the implanted waveguide 340 and conventional waveguide 330.

In an example embodiment, the implanted waveguide 340 can be formed in a different layer of the structure. For example, the implanted waveguide 340 could be formed above or below the conventional waveguide 330. If the implanted waveguide is formed above or below the conventional waveguide 330 so there is an overlap horizontally, the implanted waveguide 340 could be separated from the conventional waveguide 330 by, for example, a cladding material, such as a cladding material with a lower refractive index.

The implanted waveguide coupler 340 is formed to be erasable, and may be removed or decoupled from the conventional waveguide 330, for example by modification of the crystal lattice structure of the silicone, such as to repair damage thereto caused by the ion implantation and reverse the change in the refractive index. In an example, an annealing process can erase the implanted waveguide coupler 340 by repairing at least some of the damage to the crystal lattice structure. The annealing process may be a whole wafer process across wafer 310, or a localized process surrounding the ion implanted region forming the implanted wavelength coupler 340. In a second example, the implanted waveguide coupler 340 may be removed by further implantation of ions to the implanted region 340, for example, to cause further damage to the crystal lattice structure and to further change the refractive index.

The mechanism of coupling between the implanted waveguide coupler 340 and conventional waveguide 330 is via evanescent coupling, or butt-coupling (when the conventional waveguide 330 is touching or overlapping with implanted waveguide 340). The implantation of ions into the top silicon layer 320 causes a change in refractive index of the implantation region, allowing coupling of photons from the conventional waveguide to the ion implanted waveguide coupler (as illustrated in FIGS. 1 and 3), or thereon into a second conventional waveguide (as illustrated in FIG. 2). As outlined above, the coupling can be via evanescent coupling, where two waveguides may be spatially separated, however their optical modes extended out from the waveguides (termed an evanescent field) and have an overlap with each other. Light power will transfer from one optical mode in one waveguide to the other through the overlapped evanescent field region. The coupling can also be via butt-coupling, where two waveguides are totally or partially overlapped, and the light power can be coupled from one waveguide directly to the other via the physical overlap.

Figure 4:
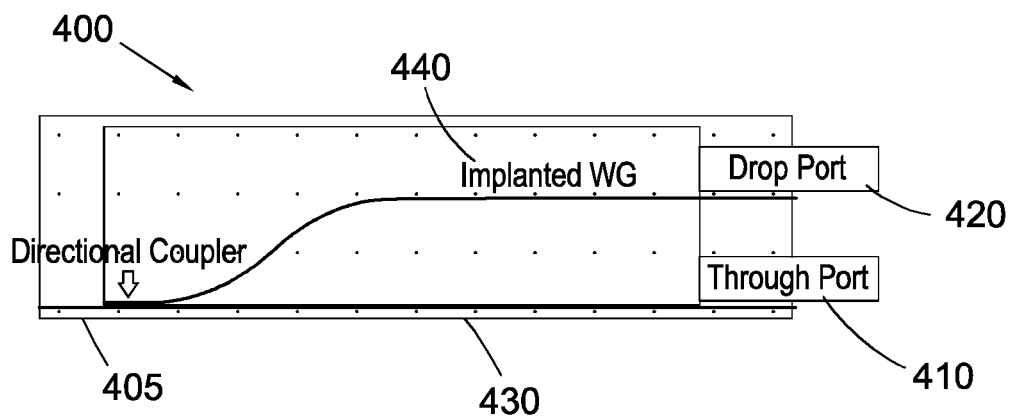
FIG. 4 is a graph showing a layout of a directional coupler in accordance with an embodiment of the present disclosure.

FIG. 4 shows a figurative illustration of a layout 400 of an implanted waveguide coupler (such as coupler 140 of FIG. 1), and a conventional waveguide (such as waveguide 130 of FIG. 1) in accordance with exemplary embodiments of the present disclosure. FIG. 4 includes a through port 410, which provides an output to a conventional waveguide 430 (corresponding to the conventional waveguide 130 of FIG. 1 or 330 of FIG. 3). FIG. 4 also includes a drop port 420, which provides an output to an implanted waveguide 440 (corresponding to the implanted waveguide coupler 140 of FIG. 1 or 340 of FIG. 3). In an example, a light signal is injected at the left end 405 of the conventional waveguide 430. A portion of the light signal may then be coupled to the implanted waveguide 440. Subsequently, the portion of the light signal coupled to the implanted waveguide 440 is transmitted out from the drop port 420, for example to another conventional waveguide (not shown), for testing purposes. The remaining light signal will stay within the conventional waveguide 430 and be transmitted out via the through port 410. If, for example after a testing process, the implanted waveguide 440 is partially or completely erased, the ratio of the power of the light signal transmitting through the drop port 420 and through port 410 will change. For example, if the implanted waveguide 440 is erased, nearly all of the light signal will stay in the conventional waveguide 430 and be transmitted out via the through port 410.

Figure 5:
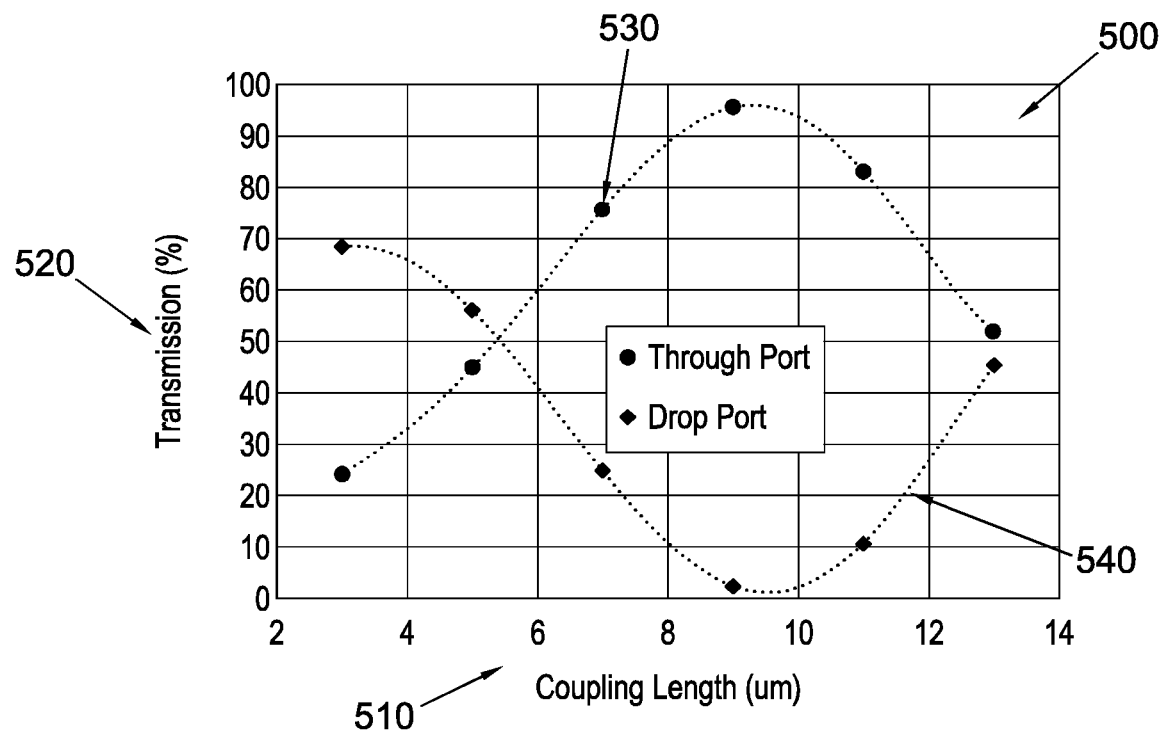
FIG. 5 is a graph showing optical transmission as a function of coupling length of an implanted waveguide coupler in accordance with an embodiment of the present disclosure.

FIG. 5 shows a graph 500 of coupling length and light transmission percentage for an implanted waveguide coupler adjacent to a conventional waveguide in accordance with exemplary embodiments of the present disclosure. The Y-axis 520 shows the transmission of light as a percentage of the input power. FIG. 5 illustrates that, in accordance with embodiments of this disclosure, a change in coupling length 510, corresponding to the length of an implanted waveguide coupler (such as implanted waveguide coupler 340 in FIG. 3) adjacent to a conventional waveguide (such as conventional waveguide 330 in FIG. 3), affects the transmission 530 of light of the through port (such as through port 410 in FIG. 4) associated with the conventional waveguide. Similarly the transmission of light 540 from a drop port (such as drop port 420 in FIG. 4) associated with the implanted waveguide also varies accordingly. The graph of FIG. 5 illustrates that a short coupling length, equating to an adjacent approximately 3 μm long implanted waveguide coupler in this example, allows almost 70% of light to couple from a conventional waveguide to the adjacent implanted waveguide coupler. This light transmission efficiency reduces as the coupling length of the implanted waveguide coupler increases to approximately 9 μm, and begins to increase again above this length to a value of approximately 45% light transmission at a coupling length of 13 μm.

Figure 6:
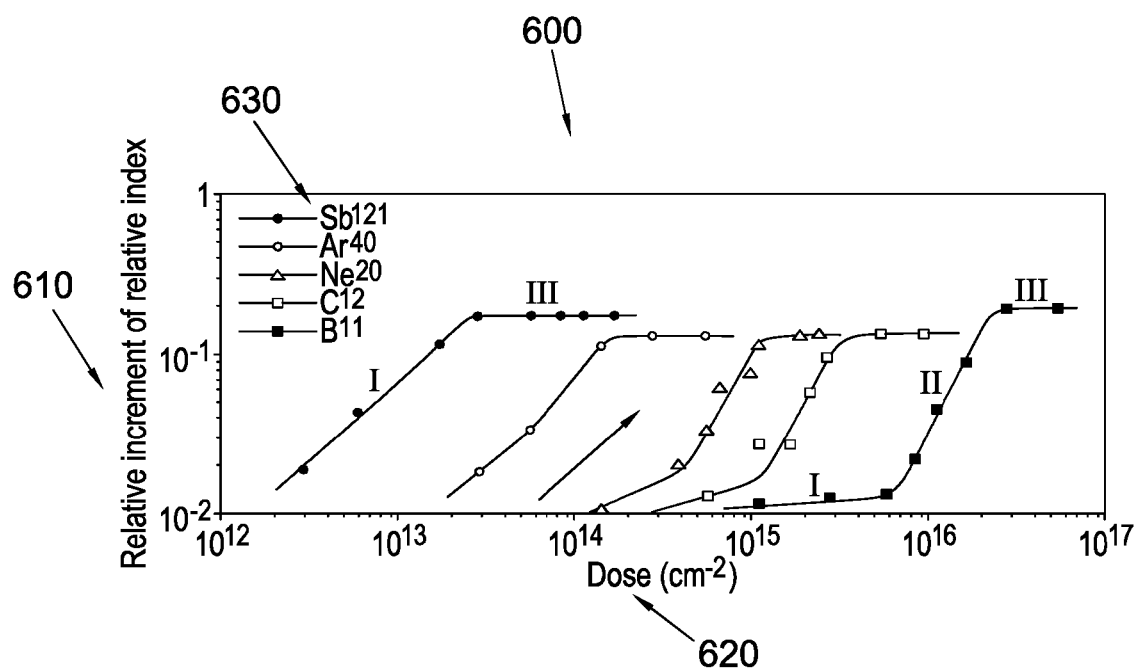
FIG. 6 is a graph showing refractive index change in silicon as a function of the dose of various ion implantation species.

FIG. 6 shows a graph 600 of change in refractive index 610 as a function of ion implant dosage 620 for several implant species 630 implanted into silicon. The graph of FIG. 6 illustrates that refractive index 610 may vary based on ion implantation dose 620, and based on a variety of ion implant species 630. In exemplary embodiments of the present disclosure, the ion implant species forming the implanted waveguide coupler may include, but is not limited to, Si, Ge, C, Sn, Ne, Ar, Kr, Xe, B, Ga, P, As, Sb or any suitable ion that can be implanted into a material to change the refractive index of said material.

Figure 7:
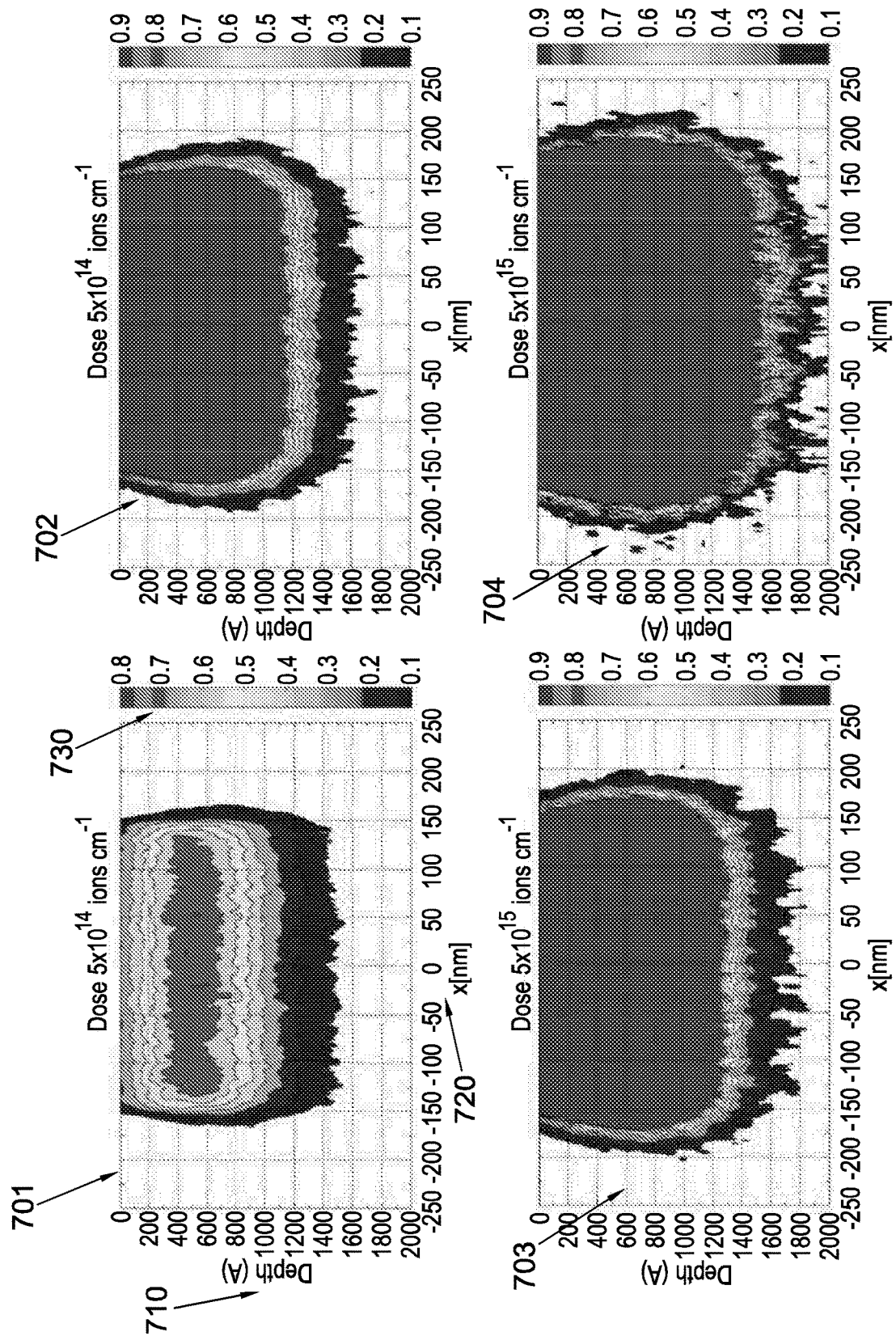
FIG. 7 shows four plots, 701-704, of implant dose variations for 100 keV implant energy of Ge into Si.

FIG. 7 shows four plots, 701-704, of implant dose variations for 100 keV implant energy of Ge into Si. The plots show depth of implant species 710 and width 720. The scale 730 represents the damage fraction, in which 80% crystal lattice disorder corresponds with a damage fraction of 0.8. The refractive index change is dominated by the percentage of lattice damage in this case.

The mechanism of change in refractive index is linked to crystal lattice change, composition, and additional charge, all of which may result from ion implantation. Therefore any suitable ion implant species that causes one or more of these changes may be suitable for creating an implanted waveguide coupler. In an example, ion implantation causes a disordering of the crystal lattice structure of a material, for example the implantation of Si or Ge ions into a silicon photonic circuit material. This disordering is from a more crystalline state to a more amorphous state.

As described above in relation to FIGS. 5, 6 and 7, coupling intensity between an implanted waveguide coupler and a conventional waveguide can be varied by changing the length of the implanted waveguide coupler, or the ion implant species or ion implant dose. Other mechanisms to vary coupling intensity may include the size, shape, location, and direction of the implanted waveguide coupler. The ion implant species, dosage, implant energy, and direction of ion implantation may also influence the coupling intensity of the implanted waveguide coupler. In this way, the coupling, and the amount of light coupled, can be controlled by controlling one or more of the above variables.

As described above, the coupling mechanism is via evanescent coupling, or butt-coupling, as a result of a change in refractive index of the material into which the ion implanted waveguide coupler is formed. The ion implanted waveguide coupler is formed to be erasable, and may be erased by a heating or annealing process, or by further ion implantation. Heating of the implanted region may cause a change in crystal lattice structure, composition, and charge, which may in turn cause a change in refractive index of this region. Similarly, a further implantation of ions into this region may also change the refractive index of this region. In an example, the ion implantation to form the implanted waveguide coupler causes the refractive index to increase, allowing coupling to an adjacent conventional waveguide. Upon heating of the structure, either by annealing the entire structure, or localized annealing of the implant region, the refractive index of the implanted region can reduce, thereby stopping the coupling of photons from, or to, the conventional waveguide. Similarly, further implantation may cause the refractive index to increase further, thereby stopping the coupling to the conventional waveguide.

In an annealing example, the mechanism of erasing the implanted waveguide coupler is through a re-ordering of the crystal lattice structure of a material, for example a silicon photonic circuit material. In this example, the annealing process causes ordering of the crystal lattice from a more amorphous state to a more crystalline state, which acts to change the refractive index and reduce or stop coupling between an implanted waveguide coupler and conventional waveguide.

In an implantation example, further ion implantation into the implant region of an implanted waveguide coupler causes further disorder of the crystal lattice structure, thereby causing the structure to become more amorphous, and changes the refractive index further. This acts to reduce or stop coupling between an implanted waveguide coupler and conventional waveguide.

Taking a mechanical analogy, the formation of the implanted optical coupler may be thought of as engaging the coupler to a conventional waveguide, allowing light to be extracted from (or inserted into) the conventional waveguide. The implanted optical coupler may then be disengaged from the conventional waveguide, for example by annealing or further implantation, to stop the extraction of light from the conventional waveguide (or input of light to the conventional waveguide).

Figure 8:
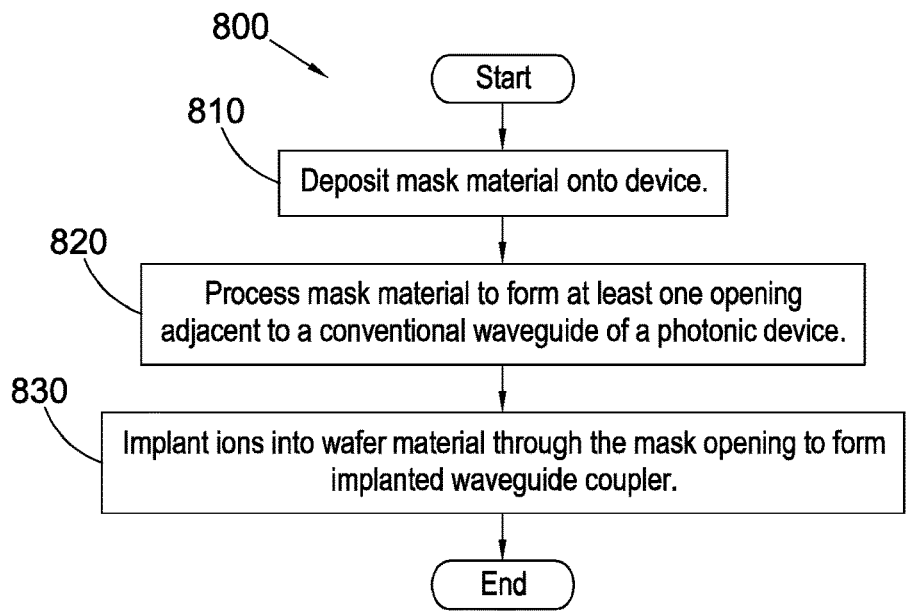
FIG. 8 is a flow chart of a method of producing an optical coupler according to an example of the disclosure.

FIG. 8 illustrates a flow chart 800 of the fabrication steps of forming an implanted waveguide coupler according to an exemplary embodiment of the present disclosure. The implanted waveguide coupler may be fabricated on a buried oxide wafer as described above in relation to FIG. 3. In an example, at step 810, a mask is deposited onto a wafer forming the photonic circuit structure including at least one conventional waveguide. The mask may be a hard mask, such as SiO2, or may be a photoresist mask. At a second step 820, the mask is processed to form at least one opening adjacent to the at least one conventional waveguide. In an example, the mask is processed using photolithography or e-beam lithography to pattern the mask, and dry or wet chemical etching to form the opening in the mask. At a third step 830, ions are implanted through the at least one opening, into the wafer forming the photonic circuit structure, adjacent to the at least one waveguide. In an optional step, the mask may be removed.

In an exemplary embodiment of the present disclosure, a test waveguide may be formed. The test waveguide may be coupled to the conventional waveguide via the implanted waveguide coupler and evanescent coupling, as illustrated by waveguide 240 of FIG. 2, or may be directly butt-coupled to the implanted waveguide coupler, for example as with the coupler 140 of FIG. 1. Test signals may be transmitted in to, or out from, the test waveguide, via the implanted waveguide coupler, into the conventional waveguide for testing a photonic circuit. After testing, the implanted waveguide coupler may be erased, as outlined above, by an annealing or further implantation process. Therefore during operation of the photonic circuit, light can transmit through the conventional waveguide, without loss due to coupling to the now erased implanted waveguide coupler.

Figure 9:
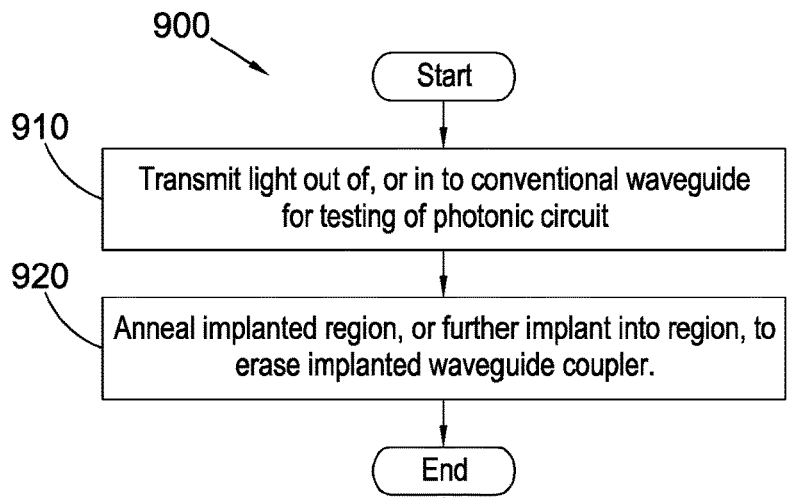
FIG. 9 is a flow chart of a method of testing a photonic device using an optical coupler and subsequently erasing the coupler, according to an example of the disclosure.

FIG. 9 shows a flow chart of a method 900 of testing the photonic circuit using the implanted coupler and then erasing the coupler.

First, in 910, light is transmitted or coupled into and/or out of the conventional waveguide via the adjacent coupler waveguide to test the photonic device.

Then, in 920, once the test has been complete, the coupling between the conventional waveguide is erased or removed, in this case by heating the substrate locally in the implanted region, or by further implanting ions, to remove the coupling to the adjacent implanted waveguide region.

Figure 10:
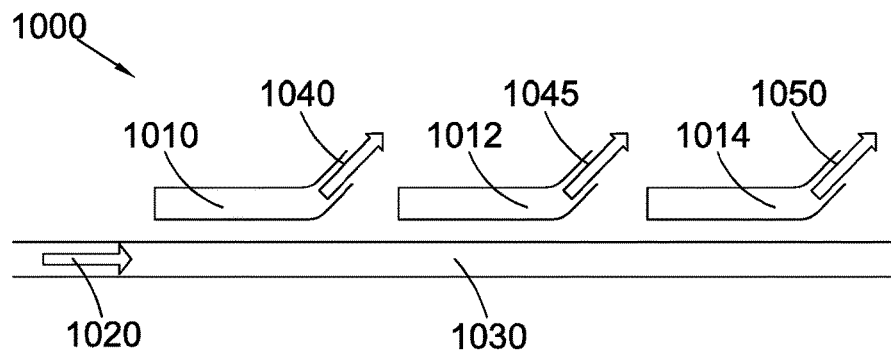
FIG. 10 is a diagram showing an array of optical couplers in accordance with an embodiment of the present invention.

FIG. 10 illustrates an exemplary embodiment 1000 of the present disclosure comprising an array of implanted waveguide couplers, such as one or more of the implanted waveguide couplers 110 of FIG. 1, and/or 210 of FIG. 2 of the present disclosure. FIG. 10 illustrates a series of implanted waveguide couplers 1010, 1012, 1014 which can be fabricated alongside one or more conventional waveguides 1030 for example by ion implantation, as described above. The design of each implanted waveguide coupler 1010, 1012, 1014 can be similar to the designs shown in FIG. 1 and/or FIG. 2. Each implanted waveguide coupler can couple a percentage of the light power from the conventional waveguide 1030. This is illustrated by arrow 1020, showing the light in the conventional waveguide 1030, and arrows 1040, 1045 and 1050, showing the coupling of a portion of light 1020 by each of implanted waveguide couplers 1010, 1020, 1030 to an output. As described above, one or more of the implanted waveguide couplers 1010, 1012, 1014 can be erased, by localized annealing or further ion implantation. Additionally, the portion of light coupled by each implanted waveguide coupler 1010, 1012, 1014 may be changed by annealing or by further ion implantation. For example, implanted waveguide coupler 1010 and 1014 may be erased, resulting in more light power 1020 coupling from the conventional waveguide 1030 through implanted waveguide coupler 1012 and to an output or another waveguide or photonic device as light 1045. In a second example, the portion of light coupled by implanted waveguide coupler 1010 may be halved, by annealing or further ion implantation but without completely erasing the implanted waveguide coupler, thereby allowing more light to couple via implanted waveguides 1012 and 1014.

An array design such as that described above can allow varying of the percentage of light power distributed to different parts of a photonic circuit. This could be used to balance the performance of the whole circuit, or to ensure all of the light power input into a circuit is transmitted to the part or the circuit under test. Regarding wafer-scale testing, this could also enable multiple tests of a photonic circuit to be performed simultaneously.

The exemplary embodiment of FIG. 10 may be scaled to form a programmable optical circuit. This can be achieved by making a generic circuit containing a number of conventional waveguides 1030 and implanted waveguide couplers 1010, 1012, 1014, and erasing selected ones of the implanted waveguide couplers 1010, 1012, 1014 to obtain any required functionality. This could be particularly useful in switching arrays for example, where only certain switching configurations are allowed. In an example, this could enable a programmable connection between N inputs and M outputs. The example of FIG. 10 shows a 1×4 photonic switching circuit. Persons of skill in the art will envisage the use of such an embodiment for programming more complex circuits.

Referring now to FIGS. 11a to 15b, the results of fabricating and testing two directional couplers in accordance with the embodiments of the disclosure shown in FIGS. 1 and 2 will now be described.

FIG. 11a shows an optical microscope image of a fabricated single-stage directional coupler in accordance with the embodiment described above in relation to FIG. 1. FIG. 11b shows an optical microscope image of a fabricated a dual-stage directional coupler in accordance with the embodiment described above in relation to FIG. 2.

The degree of transmitted non-coupled light intensity out of the through port and of coupled light out of the drop port were measured following a sequential annealing of the coupling length of the directional coupler using repeated passes of a localized laser annealing system as shown in FIG. 12a. Here, as can be seen in FIG. 12b, an Ar+ laser or another suitable laser is focused onto the surface of the wafer using a microscope objective to locally heat the surface. The stage on which the wafer is placed is then operated so as to move the focused annealing laser beam sequentially across the end of the ion implanted waveguide to sequentially anneal and erase sections of the ion implanted waveguide to reduce the coupling length Lc of the single and dual stage directional couplers.

At each stage of reducing coupling length Lc, a measurement was taken of the proportion of the input light that was transmitted to the through port, and the proportion of the input light that was coupled through the directional coupler and transmitted to the drop port.

Figure 13:
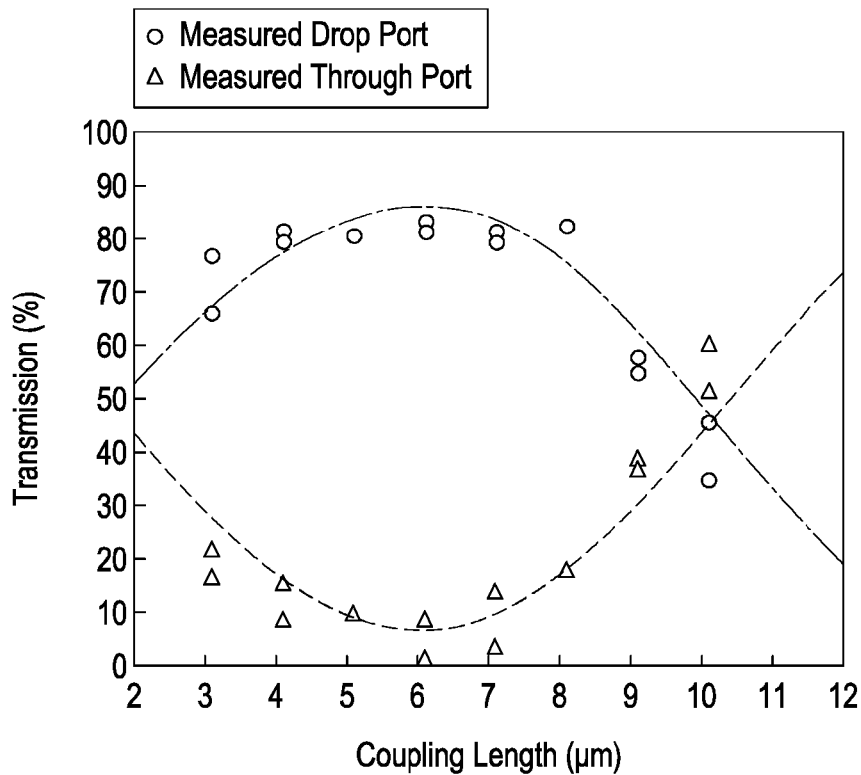
FIG. 13 is a graph showing the coupled light intensity through the single stage directional coupler of FIG. 11a for reducing coupling lengths.
Figure 14:
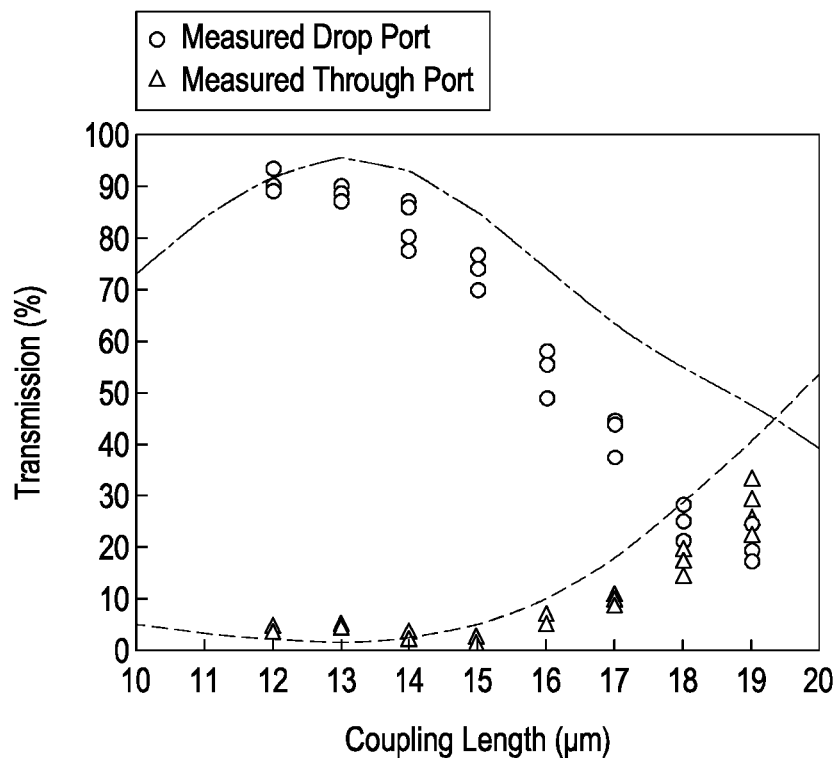
FIG. 14 is a graph showing the coupled light intensity through the dual stage directional coupler of FIG. 11b for reducing coupling lengths.

The results are plotted as points in FIG. 13, for the single stage coupler, and in FIG. 14, for the dual stage coupler, with the dotted lines showing the simulated results. Here it can be seen that the behavior of the fabricated directional couplers is as expected from the simulations.

Similarly, FIG. 15a shows an optical microscope image of a fabricated 1×4 photonic switching circuit and FIG. 15b shows an optical microscope image of a fabricated 2×2 photonic switching circuit.

The usability and effectiveness of these devices as controllable switching circuits was tested by selectively completely annealing the directional couplers to switch between the inputs and outputs.

Initially, the 1×4 photonic switching circuit is initially configured to couple a maximum amount of the input light travelling through each coupler to each of the output ports P1, P2, P3 and P4. Measurements of the transmitted light intensity were taken at each of the output ports with the switching circuit in its initial state, and then after its first, second, and third sequential couplers are annealed and erased. The results are shown in FIGS. 16a, b, c and d, respectively.

In FIG. 16a, it can be seen that in the initial state, with all couplers remaining, the majority of input light is coupled to the first port P1 with the signal strength being 14.4 dB greater that the output at P2 at 1550 nm. Then, in FIG. 16b, it can be seen that with the first coupler erased, the majority of input light is no longer coupled to the first port P1, but rather it is coupled to the second port P2, with the signal strength being 12.9 dB greater that the output at P1 and P3 at 1550 nm. Then, in FIG. 16c, it can be seen that with the second coupler erased, the majority of input light is no longer coupled to the second port P2, but rather it is coupled to the third port P3, with the signal strength being 11.6 dB greater that the output at the other ports at 1550 nm. Finally, in FIG. 16d, it can be seen that with the third coupler erased, the majority of input light is no longer coupled to the third port P3, but rather it is coupled to the fourth port P4, with the signal strength being 13.1 dB greater that the output at the other ports at 1550 nm.

Referring again to FIG. 15b, the 2×2 photonic switching circuit was initially configured with directional couplers so that it operates in cross coupling mode, such that the light input at terminal T1 is coupled across to be output at port P2, and such that the light input at terminal T2 is coupled across to be output at port P1. A measurement of operation in this cross coupling mode this can be seen in FIG. 17a, which shows that the input light at T1 and T2 is indeed coupled across to the opposing port, P2 and P1 respectively, with the signal difference to the through coupled ports being 18.3 dB at 1550 nm.

Then, to switch the 2×2 photonic switching circuit in through coupling mode, the directional couplers of the device were annealed to remove them and remove the cross coupling. A measurement of operation in this through coupling mode this can be seen in FIG. 17b, which shows that the input light at T1 and T2 is indeed coupled across to the respective through ports P1 and P2, with the signal difference with the cross coupled ports being 23.1 dB at 1550 nm.

While in the embodiments described above, an external laser source is used to locally heat and anneal the wafer to erase, e.g. selectively, the directional couplers, other local annealing methods may be suitable. For example, the photonic device may be provided with an eraser system configured to heat a region including the ion implanted region to modify the crystal structure of the wafer material in the region to change the refractive index thereof and remove the optical coupling with the adjacent conventional waveguide. The eraser system may be provided on the photonic device by a resistive heating element, as shown in FIG. 18. In the embodiment shown, the resistive heating element comprises, as shown in the view from the top seen in FIG. 18a, a resistive metal heater deposited on the surface of the wafer having metal contacts on each side of the conventional waveguides of the dual stage directional coupler, and a narrowed heating element aligned bridging the conventional waveguides and extending along the surface of the wafer aligned with the ion implanted region providing the coupling waveguide. FIG. 18b shows in a cross section through the ion implanted region and the neighboring conventional rib waveguides, the layer of metal on top of the wafer providing the resistive metal heating element. The resistive heater may be arranged on the photonic device so as to locally heat and anneal the ion implanted region when an electrical current passes through the resistive heating element. In this way, the photonic device may be fabricated with a switching mechanism, for example, using a CMOS compatible metal deposition process, to provide a directional coupler erasing system which may be operated in use following testing of the device.

Throughout the description and claims of this specification, the words "comprise" and "contain" and variations of them mean "including but not limited to", and they are not intended to (and do not) exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers or characteristics described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

What is claimed is:

1. A method of forming an erasable optical coupler in a photonic device comprising a conventional optical waveguide formed in a crystalline wafer having a crystal lattice structure, the method comprising:
    selectively implanting ions in a localized region of the crystalline wafer alongside and adjacent to the conventional optical waveguide of the photonic device, to cause modification of the crystal lattice structure of, and a change in refractive index in, the localized region of the crystalline wafer to thereby form an ion implanted waveguide alongside the conventional optical waveguide and optically coupled to the conventional optical waveguide to couple light out therefrom, or in thereto, wherein the crystalline wafer and the ion implanted waveguide are such that the crystal lattice structure or composition can be modified to adjust or remove the optical coupling with the conventional optical waveguide by further modification of the refractive index in the localized region.

2. The method of claim 1, further comprising controlling, in the selective ion implantation, one or more of the size, shape, or location of the localized region of the crystalline wafer in which ions are to be implanted, or the direction of implantation, or the species, dosage or energy of the implanted ions, to control the optical coupling between the conventional optical waveguide and the ion implanted waveguide formed thereby.

3. The method of claim 1, wherein the size, shape, or location of the localized region, the direction of implantation, and the species, dosage, or energy of the implanted ions, are selected to obtain a predetermined amount of optical coupling between the conventional optical waveguide and the ion implanted waveguide.

4. The method of claim 1, wherein the further modification of the refractive index in the localized region comprises the application of heat by annealing.

5. The method of claim 1, wherein the further modification of the refractive index in the localized region comprises additional ion implantation.

6. The method of claim 1, further comprising performing a test of the photonic device by coupling light into, or out of, the conventional optical waveguide through the ion implanted waveguide.

7. The method of claim 1, further comprising heating the localized region to modify the crystal lattice structure of the crystalline wafer in the localized region to change the refractive index thereof and adjust or remove the optical coupling with the conventional optical waveguide.

8. The method of claim 7, wherein heating the localized region comprises heating by localized annealing.

9. The method of claim 1, wherein the implanted ions comprise Si or Ge.

10. The method of claim 1, wherein the implanted ions modify the crystal lattice structure of the crystalline wafer from a more ordered state to a less ordered state.

11. The method of claim 1, wherein heating the ion implanted waveguide changes the crystal lattice structure therein from a less ordered state to a more ordered state.

12. The method of claim 1, wherein selectively implanting the ions in the localized region of the crystalline wafer comprises:
    depositing a mask material onto the photonic device;
    processing the mask material to form at least one opening adjacent to the conventional optical waveguide of the photonic device; and
    implanting ions in the crystalline wafer through the opening of the mask material adjacent to the conventional optical waveguide of the photonic device.

13. The method of claim 12, wherein the mask material comprises a photoresist layer or a hardmask.

14. The method of claim 12, wherein processing the mask material includes:
    patterning the mask material with a photolithographic or e-beam lithographic process; and
    etching the mask material to form the at least one opening of the mask material.

15. A method comprising:
    implanting ions into a wafer material adjacent to a conventional waveguide of a photonic device provided thereby, the ion implanting forming a waveguide in the wafer material alongside the conventional waveguide and configured as an optical coupler waveguide to couple light into and out of the conventional waveguide, wherein the wafer material and the optical coupler waveguide are such that a crystal lattice structure or composition can be modified to adjust or remove the optical coupling with the conventional waveguide by further modification of the refractive index in the wafer material adjacent to the conventional waveguide;

coupling light into and out of the conventional waveguide via the optical coupler waveguide to test the photonic device; and heating the wafer material to remove the optical coupler waveguide.

16. An apparatus comprising:

a substrate formed of a wafer material;

a conventional optical waveguide formed in the wafer material;

an optical coupler waveguide formed temporarily in the wafer material alongside and adjacent to the conventional optical waveguide, the optical coupler waveguide being configured to couple light into, or out of, the conventional optical waveguide during a test; and wherein the wafer material and the optical coupler waveguide are such that a crystal lattice structure or composition can be modified to remove the optical coupling with the optical coupler waveguide by heating the wafer material to modify the refractive index of the optical coupler waveguide.

17. The apparatus of claim 16, further comprising an eraser system configured to heat a region including the optical coupler waveguide to modify a crystal structure of the wafer material in the region to change the refractive index thereof and remove the optical coupling with the conventional optical waveguide.

18. The apparatus of claim 17, wherein the eraser system comprises a resistive heating element arranged on the substrate so as to locally heat and anneal the optical coupler waveguide when an electrical current passes through the resistive heating element.

19. The apparatus of claim 16, wherein the conventional optical waveguide is formed as a rib waveguide structure, and wherein the optical coupler waveguide is formed adjacent to a rib waveguide of the rib waveguide structure.

20. The apparatus of claim 16, further comprising a test waveguide coupled to the optical coupler waveguide to couple light into and out of the conventional optical waveguide through the optical coupler waveguide.

* * * * *